(12) United States Patent
Lee et al.

(10) Patent No.: US 6,650,594 B1
(45) Date of Patent: Nov. 18, 2003

(54) DEVICE AND METHOD FOR SELECTING POWER DOWN EXIT

(75) Inventors: Jung-Bae Lee, Yongin-Shi (KR); Dong-Yang Lee, Yongin-Shi (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/281,342

(22) Filed: Oct. 28, 2002

Related U.S. Application Data
(60) Provisional application No. 60/395,276, filed on Jul. 12, 2002.

(51) Int. Cl.[7] .............................. G11C 8/00; G11C 7/00
(52) U.S. Cl. ...................... 365/233; 365/194; 365/226
(58) Field of Search ................................. 365/233, 194, 365/230.06, 189.05, 191, 226, 229, 230.8

(56) References Cited

U.S. PATENT DOCUMENTS

| | | | |
|---|---|---|---|
| 5,614,855 A | 3/1997 | Lee et al. | |
| 5,708,611 A | 1/1998 | Iwamoto et al. | |
| 6,400,643 B1 * | 6/2002 | Setogawa | 365/233 |
| 2002/0015328 A1 * | 2/2002 | Dono et al. | 365/185.08 |

* cited by examiner

Primary Examiner—Thong Le
(74) Attorney, Agent, or Firm—F. Chau & Associates, LLP

(57) ABSTRACT

A semiconductor integrated circuit and a memory device capable of selecting power-down exit speed and power-save modes and method thereof are provided. The memory device includes a command decoder for generating a power-down signal in response to a power-down command, a mode register (MRS) for storing power-down exit information, a clock synchronization circuit such as a DLL or PLL circuit for generating an internal clock signal synchronized with an external clock signal, and a controller for controlling the DLL or PLL circuit. At power-down exit of the memory device, the power-down exit information can be selected between a fast wakeup time and a slow wakeup time.

23 Claims, 9 Drawing Sheets

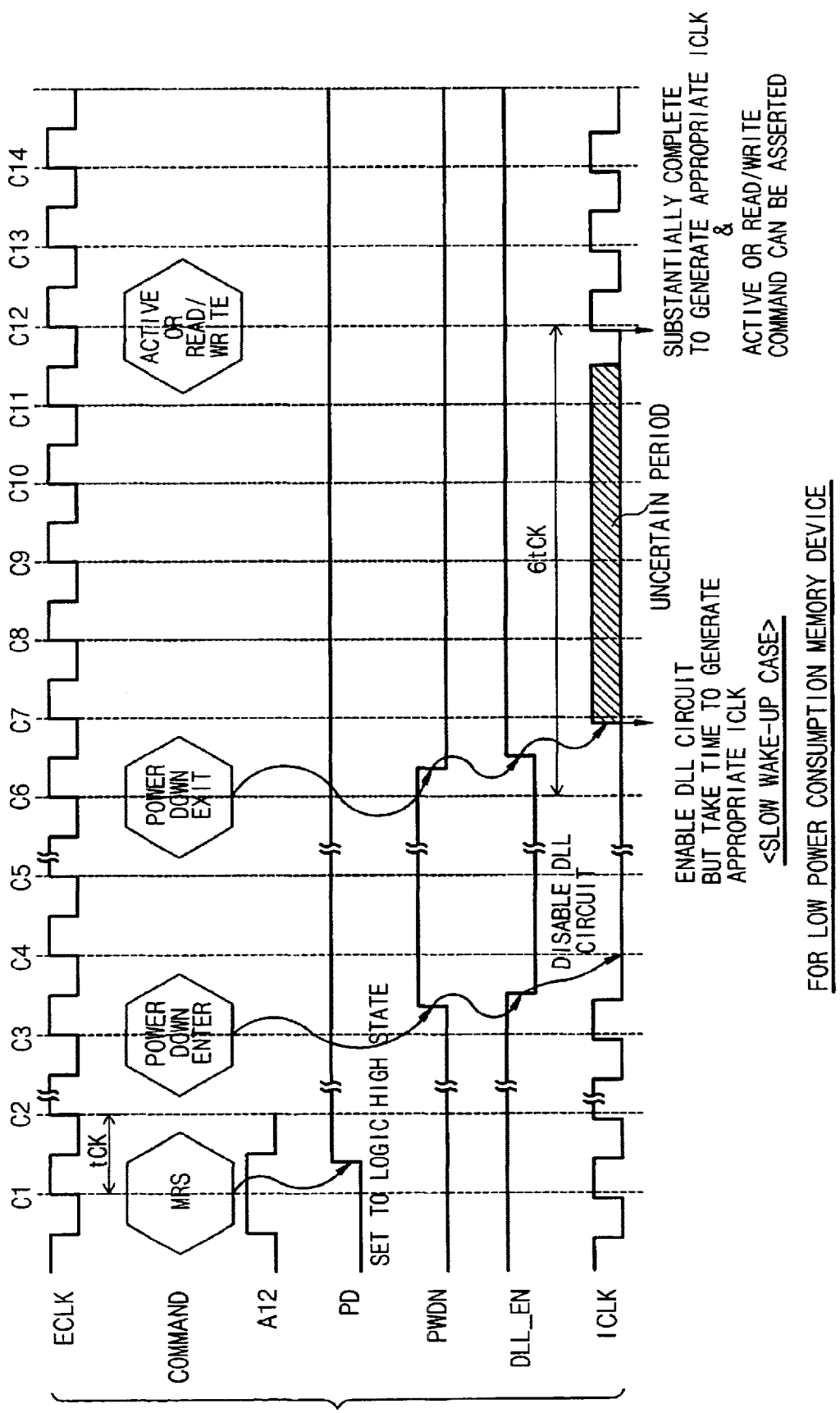

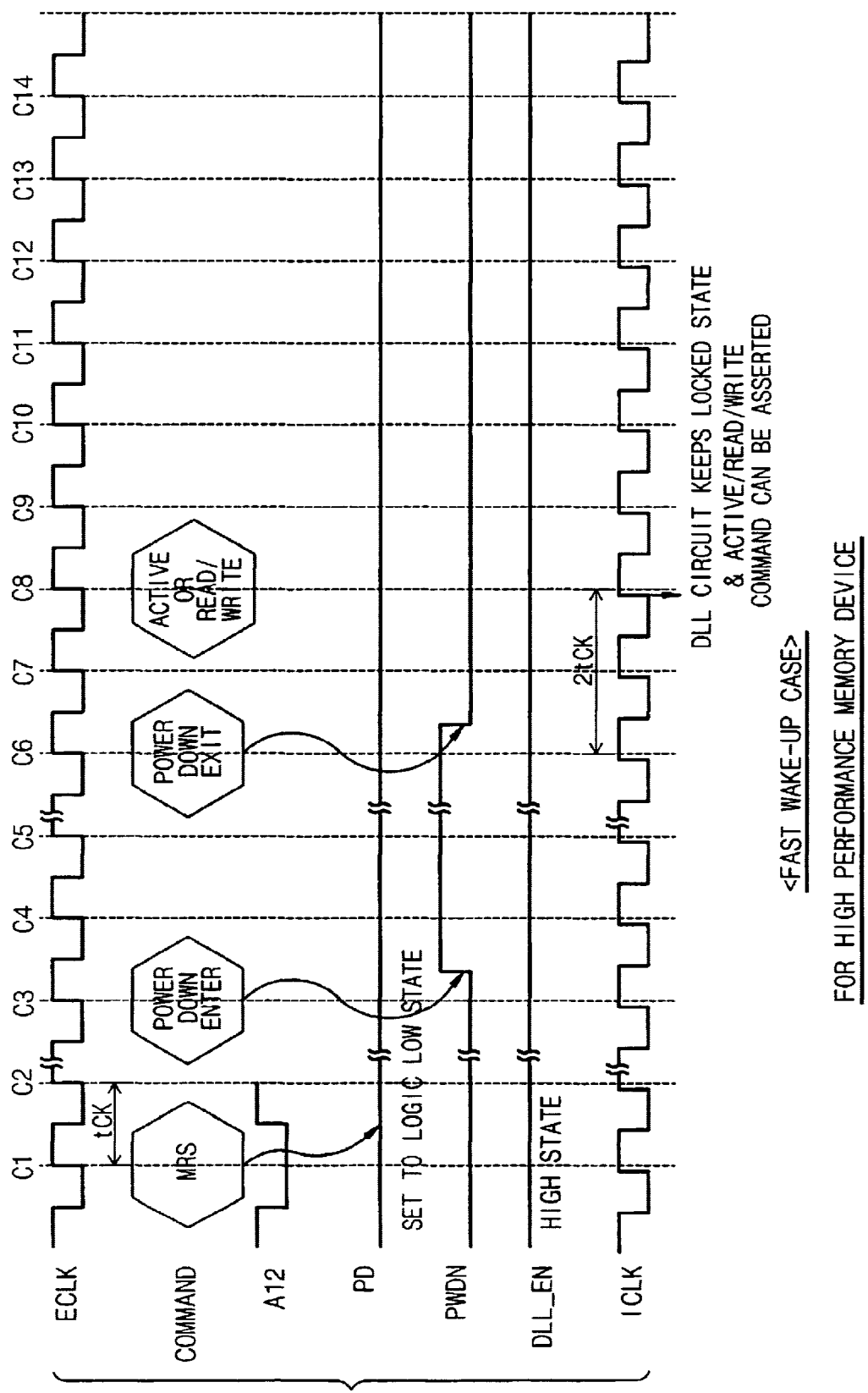

US 6,650,594 B1

DEVICE AND METHOD FOR SELECTING POWER DOWN EXIT

PRIORITY DATA

The present application claims priority to Provisional Application 60/395,276, filed on Jul. 12, 2002 the disclosure of which in its entirety is incorporated by reference herein.

BACKGROUND OF THE INVENTION

1. Technical Field

The present invention relates to a device and method for controlling a semiconductor memory device and more particularly, to a circuit or memory device having a circuit for controlling a memory and controlling operations of the memory in selectable power down exit modes.

2. Discussion of Related Art

As operating speed and capacity of semiconductor memory devices continually increase, it is advantageous to incorporate memory control circuits such as a clock synchronization unit within the memory device. The clock synchronization unit is used for generating an internal clock signal in synchronization with an external clock signal such as a system clock. The internal clock is used to synchronously drive memory devices such as SDRAMs and DDR-SDRAMS. The clock synchronization unit can be a phase-locked loop (PLL), delay-locked loop (DLL), or duty-cycle correction circuit.

A PLL circuit typically includes a phase detector, a charge pump, a loop filter, and a voltage controlled oscillator (hereinafter referred to as "VCO"). By comparing phases of an external clock signal and an internal clock signal (i.e., an output of the VCO), the phase detector generates an up or down signal based on differences between the phases thereof, and transfers the up or down signal to the loop filter. The charge pump generates a constant output voltage according to the up or down signal, and transfers the constant output voltage to the loop filter. The loop filter filters the output voltage of the charge pump to eliminate a high frequency element, and outputs a control voltage for controlling the VCO. The VCO inputs the control voltage to output a frequency that is proportional thereto. As a result, the PLL circuit synchronizes an output frequency with an input frequency to synchronize the phases of the internal and external clock signals.

In a DLL circuit, when synchronizing the phases of the external and internal clock signals, the DLL circuit delays the phase of the external clock signal. DLLs are commonly used in DRAM devices. One exemplary DLL circuit is disclosed in U.S. Pat. No. 5,614,855 to Lee. Another exemplary DLL circuit varies a length of a delay line through which the clock signal traverses. Delay line variation can be done using a tapping point for selectively activating a coarse delay chain and a fine delay chain. A phase detector is coupled to the delay line to detect phase differences.

Other phase or Duty-Cycle correction (DCC) circuits can be in the form of a register storing a phase delay value of the internal and external clock signals. The phase delay value is stored at power-down and is loaded at power-down exit to lock the internal and external clock signals. In each of the above clock synchronization circuits, the operation of the clock synchronization circuit and the drive buffer necessary for fanning out the clock signal to the internal circuits of the SDRAM consume a large amount of power.

To conserve power, the SDRAM can be put in a power-down mode when access to the SDRAMs is not needed.

FIGS. 1 to 3 illustrate a conventional memory device, a mode register set and power-down circuit.

FIG. 1 shows a mode register set(MRS) used in the memory device of FIG. 2. The MRS has address fields A0–A12 in which information (e.g., burst length, burst type (BT), CAS latency, and test mode) for controlling an operation mode of the SDRAM is stored. This information is issued from a central processing unit (CPU) to direct the memory device to operate in different modes. Conventionally, the burst length, the burst type, the CAS latency, and the test mode use the fields A0–A2, the field A3, the fields A4–A6, and the field A7, respectively. The fields A8–A12 are reserved for future use (RFU) and they are generally set to "0" during normal operation.

FIG. 2 shows a conventional memory device including components of a memory core 100 having an array of memory cells; a mode register 250 having address fields and operation mode information essentially as described for FIG. 1; address decoders 270 and 280, DLL circuit 230 for generating an internal clock ICLK; clock, address, and data buffers; and a command buffer and decoder 240. Commands from the CPU or memory controller are received by the command buffer and decoder 240. The commands are processed and distributed to the pertinent components such as mode register 250 for accessing the memory core 100. An external clock ECLK is received by clock buffer 210 and buffered clock ECLK1 is input to DLL circuit 230 through a DLL enable circuit 220. The DLL circuit 230 generates an internal clock ICLK for driving the memory core 100. The memory core 100 can be placed in a power down or standby mode, wherein the memory cells within the memory core 100 are not accessed and power is conserved. A power-down command PWDN, issued from the command buffer and decoder 240, is used to place the memory device in (enter) or out (exit) of a power down mode. This is done by a circuit shown in FIG. 3. As shown, external clock signal ECLK is buffered by clock buffer 210 and passes through gate 224 to DLL circuit 230, wherein internal clock ICLK synchronized to ECLK is generated to drive the memory. When it is desired to place the memory device in power-down mode, an active command (entering power down mode) at PWDN (e.g. logic "1") disables logic gate 224, which deactivates internal clock signal ICLK output from DLL circuit 230. Without a clock signal, the memory core 100 cannot operate, it is placed in "power-down" mode, and power consumption is conserved.

In the conventional memory device and power-down mode operation as described for FIGS. 1 to 3 above, it is noted that although the internal clock signal ICLK is deactivated by disabling the buffered clock ECLK1 at DLL enable circuit 220, the DLL circuit 230 is not turned off. Thus, if further conservation of power is needed, the DLL circuit 230 can also be turned off. It is to be appreciated that the description of a DLL circuit herein is also applicable to other clock synchronization circuits such as PLL and duty-cycle correction circuits. As earlier described, a DLL or PLL includes numerous components such as a phase detector, a charge pump and a VCO. Turning off the clock synchronization circuit accomplishes sizeable power savings. However, with the PLL or DLL turned off, more time is needed to reach phase lock or synchronization between the internal and external clock. Typically, about at least six (6) clock cycles are needed to synchronize the internal clock signal to the external clock signal. Therefore, there exists a trade-off between power savings and the time required to wakeup or exit from power-down mode.

Wakeup or exit from power-down mode brings the device from power down or standby mode back to normal operation. After the power-down exit command, some amount of time is needed before the device can operate normal operations properly. The normal operations can be an active operation (or active command), a read operation (read command), or a write operation (write command), etc.

It is therefore desirous to have a memory device capable of selecting a plurality of power saving modes.

SUMMARY OF THE INVENTION

A circuit for controlling a memory having an array of memory cells arranged in rows and columns, the circuit comprising; at least one address decoder for decoding an address field and outputting decoded addresses for addressing the memory; and a mode register for storing mode register set (MRS) data used for specifying at least one of a plurality of operation modes of the memory based on the address field, wherein the plurality of operation modes include a plurality of power down exit modes.

The circuit preferably further comprising; a clock generator for generating a clock signal in synchronization with an external clock signal for clocking the memory; and a generator enable circuit for directly or indirectly receiving the external clock signal and a power-down command to selectively enable outputting the external clock signal to the clock generator based on the power down command. The generator enable circuit further receives an exit mode select signal (PD) for selectively enabling the power down command, the exit mode select signal (PD) for selecting at least one of the power-down exit modes.

The plurality of power-down exit mode includes a slow wakeup exit mode and a fast wakeup exit mode, wherein the memory operates in normal mode within a first number of clock cycles from receipt of slow wakeup exit mode and within a second number of clock cycles from receipt of fast wakeup exit mode, wherein the second number is smaller than the first number. Preferably, the first number is at least five and the second number is at least two.

The clock enable circuit receives the exit mode select signal (PD) and outputs a supplemental power-down signal (SPD) to cause a power down of circuitry other than the memory cells. The circuitry other than the memory cells includes at least a portion of the clock generator. The address field includes A0 to A12 and the exit mode select signal (PD) corresponds to A12.

The memory is an SDRAM or a DDR SDRAM. The clock generator is a phase-locked loop, a delay-locked loop, a duty-cycle correction circuit. The address field and the PWDN command are provided from a memory controller.

A memory system is also provided for controlling a memory having an array of memory cells arranged in rows and columns, the memory control system comprising; at least one-address decoder for decoding an address field and outputting decoded addresses for addressing the memory; a mode register for storing mode register set (MRS) data used for specifying at least one of a plurality of operation modes of the memory based on the address field, wherein the plurality of operation modes include a plurality of power-down exit modes; and a memory controller for providing the address field and signals for generating the MRS. The further comprising; a clock generator for generating a clock signal in synchronization with an external clock signal for clocking the memory; and a generator enable circuit for directly or indirectly receiving the external clock signal and a power-down command to selectively enable outputting the external clock signal to the clock generator based on the power down command.

The generator enable circuit further receives an exit mode select signal (PD) for selectively enabling the power-down command, the exit mode select signal (PD) for selecting at least one of the power-down exit modes.

A circuit is further provided for controlling a memory having an array of memory cells arranged in rows and columns, the circuit comprising; at least one address decoder for decoding an address field and outputting decoded addresses for addressing the memory; and a logic circuit for receiving signals specifying at least one of a plurality of operation modes of the memory based on the address field, wherein the plurality of operating modes include a plurality of power-down exit modes.

The circuit further comprising; a clock generator for generating a clock signal in synchronization with an external clock signal for clocking the memory; and a generator enable circuit for receiving the external clock signal and a power-down command to selectively enable outputting the external clock signal to the clock generator based on the power down command, wherein the generator enable circuit further receives an exit mode select signal (PD) for selectively enabling the power-down command, the exit mode select signal (PD) for selecting at least one of the power-down exit modes.

A method is also provided for of controlling a memory having an array of memory cells arranged in rows and columns, the method comprising; decoding an address field and outputting decoded addresses for addressing the memory; and storing mode register set (MRS) data used for specifying at least one of a plurality of operation modes of the memory based on the address field, wherein the plurality of operation modes include a plurality of power down exit modes.

The method further comprising the steps of; generating by a clock generator an internal clock synchronized to an external clock, the internal clock for clocking the memory; and disabling the clock generator based on a power down command and one of the plurality of power-down exit modes.

The method further including the step of assigning one address bit of the address field as a exit mode select signal for selecting one of the plurality of power-down exit modes. Preferably, the one address bit is any of A8 to A12 (the RFU field) of an A0 to A12 address field.

BRIEF DESCRIPTION OF THE DRAWINGS

FIG. 7A shows a timing diagram of a power-down exit mode operation according to an embodiment of the present invention.

FIG. 7B shows a timing diagram of another power-down exit mode operation according to an embodiment of the present invention.

DESCRIPTION OF PREFERRED EMBODIMENTS

According to embodiments of the present invention, when a memory is exiting from a power-down mode to a normal mode, wakeup time and power consumption of the memory can be selected. The normal mode can be an active command, a read command or a write command. The selection can be based on power-down exit information stored in a mode register (MRS). If power conservation in an SDRAM is preferred, such as in mobile products, a slower wakeup but power-save mode is selected. If the memory (e.g., SDRAM) is employed in a high performance-computing device, where high-speed wakeup is preferred, a fast wakeup power-down exit mode is selected.

Figure 1:
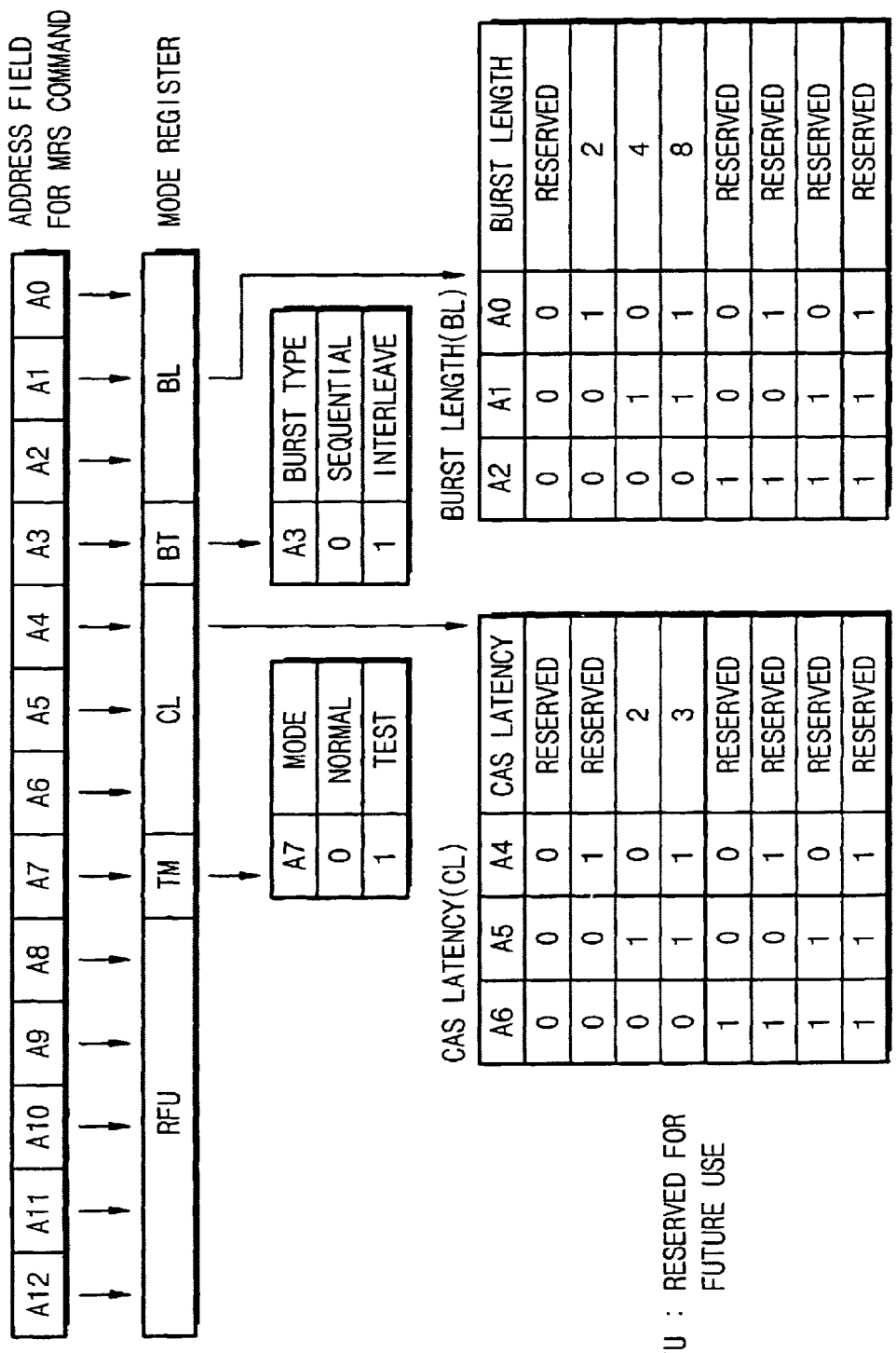
FIG. 1 shows a conventional mode register set (MRS).
Figure 2:
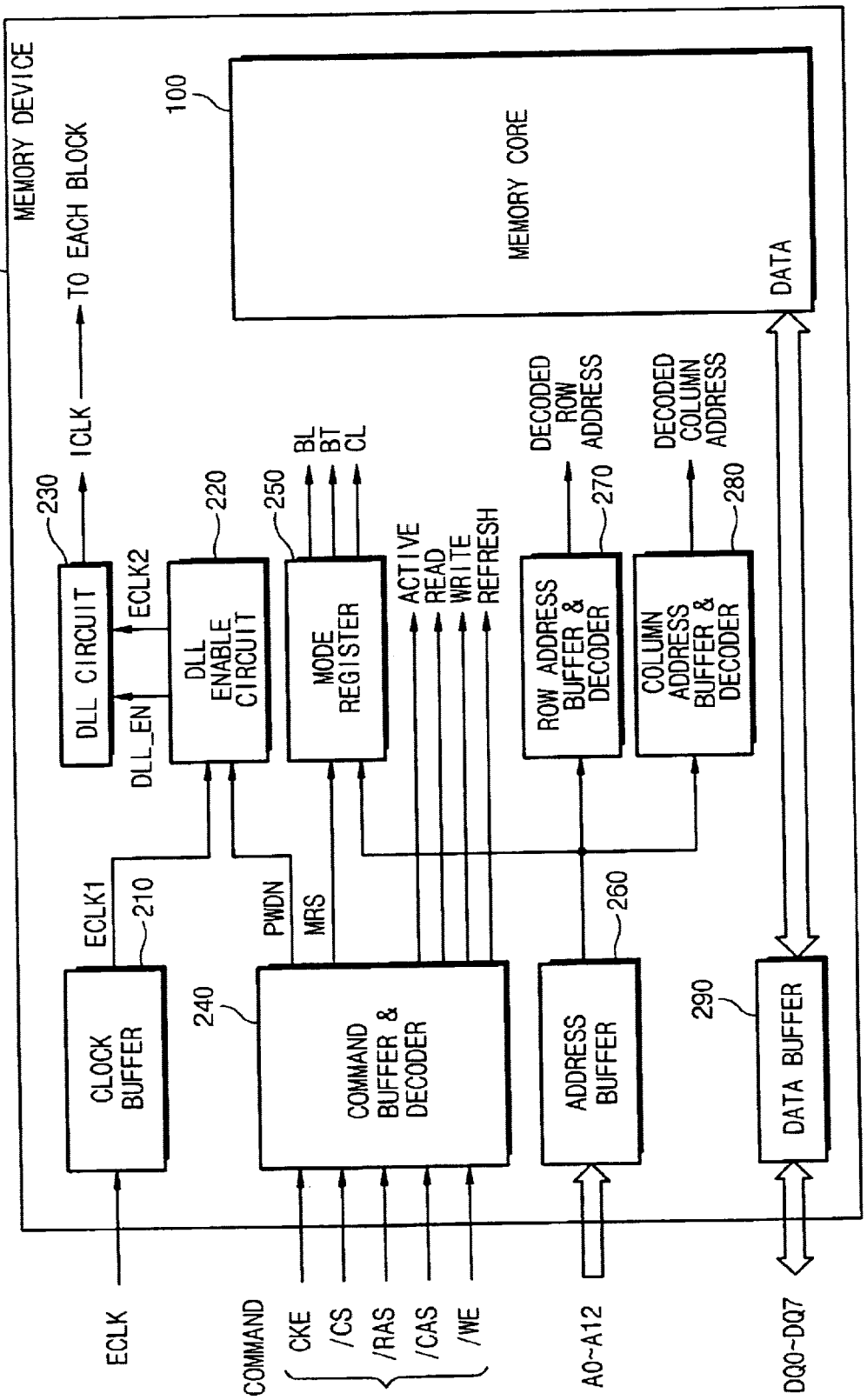
FIG. 2 shows a conventional memory device.
Figure 3:
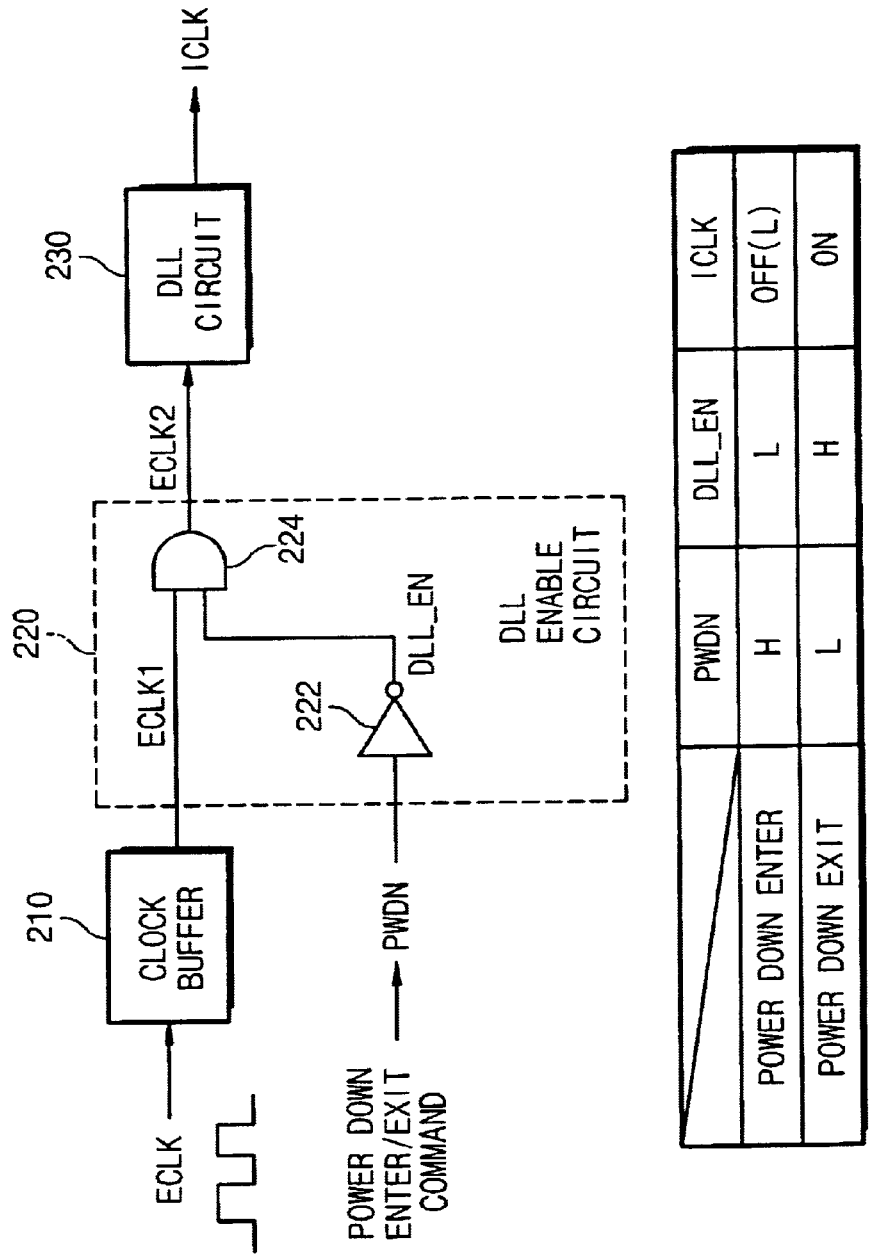
FIG. 3 shows a conventional clock enable circuit in the memory device of FIG. 2.
Figure 4:
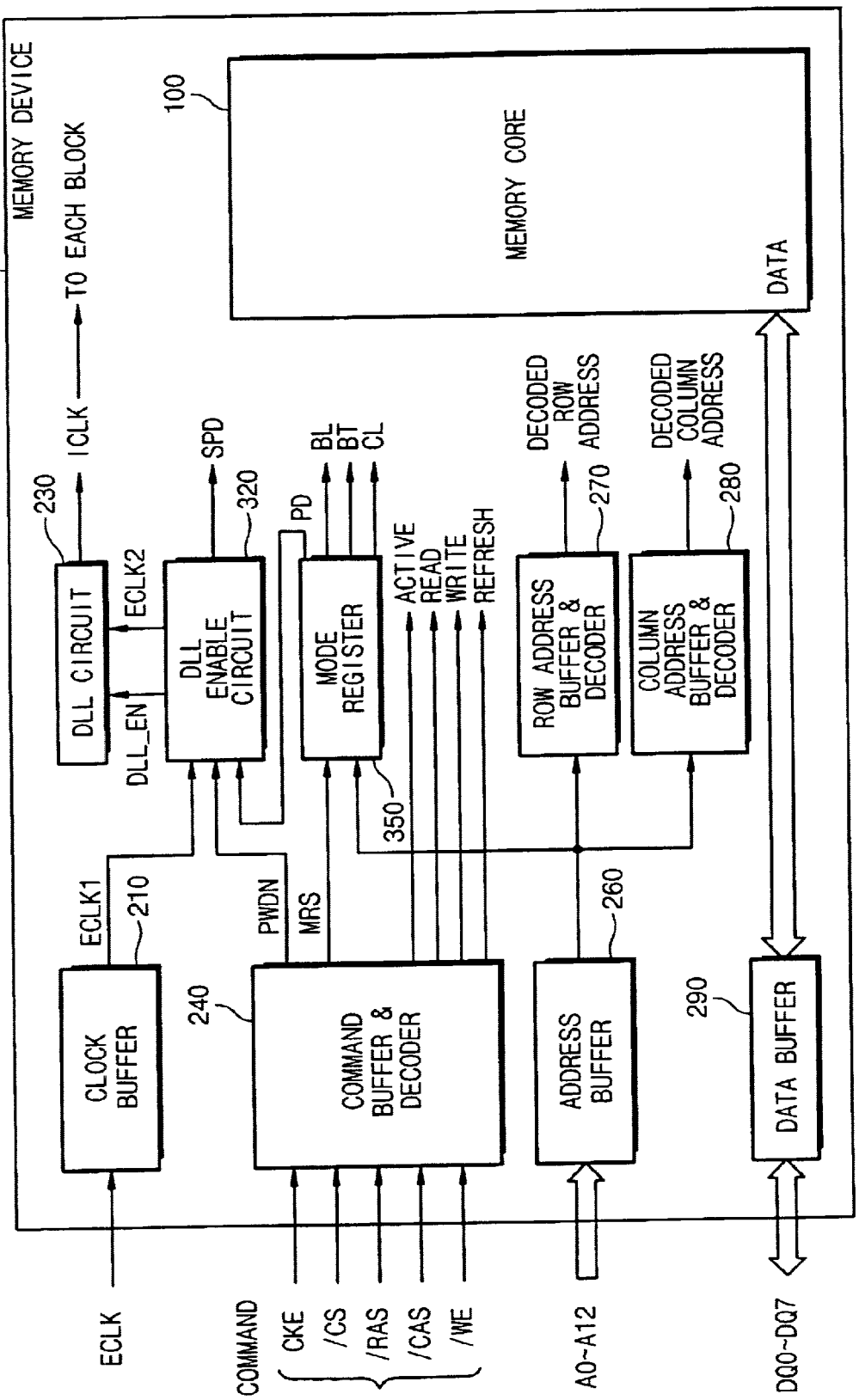
FIG. 4 shows a memory device according to an embodiment of the present invention.

FIG. 4 shows a memory device according to an embodiment of the present invention. The memory device 10 comprises the memory core 100, which is a DRAM having an array of memory cells arranged in rows and columns. The DRAM is preferably an SDRAM or a DDR SDRAM. Row address buffer and decoder 270 and column buffer and decoder 280 provide the row addresses and the column addresses during memory read/write operations. Data to memory core 100 is input via data buffer 290, address buffer 260 receives an address field, preferably A0–A12, and provides the addresses to the row address buffer and decoder and column address buffer and decoder, and mode register 350. Command buffer and decoder 240 receives and decodes commands from, according to the present embodiment, an external source and provides decoded commands to the memory core 100 through peripheral circuit (not shown). The decoded commands of command buffer and decoder 240 include a mode register set (MRS) for input to the mode register 350 and a power-down PWDN command for coupling to the DLL enable circuit 320. DLL circuit 230 is a clock synchronization circuit for generating an internal clock ICLK used for driving the memory core 100. The power-down PWDN command is used to power down the memory core, preferably by disabling the internal clock ICLK, placing the memory core 100 in standby mode. DLL circuit 230 can be any clock synchronization circuit employing feedback and phase lock such as PLL, DLL, DCC, or the like. DLL is used herein for illustrating a preferred embodiment of the invention. Clock buffer 210 receives and buffers external clock ECLK and provides a buffered clock signal ECLK1 to the DLL enable circuit 320.

According to a preferred embodiment of the present invention, a power-down exit mode select signal (PD) is provided via the mode register 350 to the DLL enable circuit 320 to provide a selectable plurality of power-down exit modes. The plurality of exit command modes preferably include a fast wakeup mode and a power save or a slow wakeup mode, wherein the fast wakeup mode affords the user a faster wakeup of the SDRAM from power-down mode preferably in two (2) to four (4) clock cycles. The power-save or slow wakeup exit mode affords the user further power savings but exiting from power down of the SDRAM requires more time, in at least five (5) but preferably six (6) to ten (10) clock cycles. Power-down exit mode select signal PD is output from mode register 350 to DLL enable circuit 320 for selectively controlling the DLL circuit 320 and DLL enable circuit 230.

Figure 5:
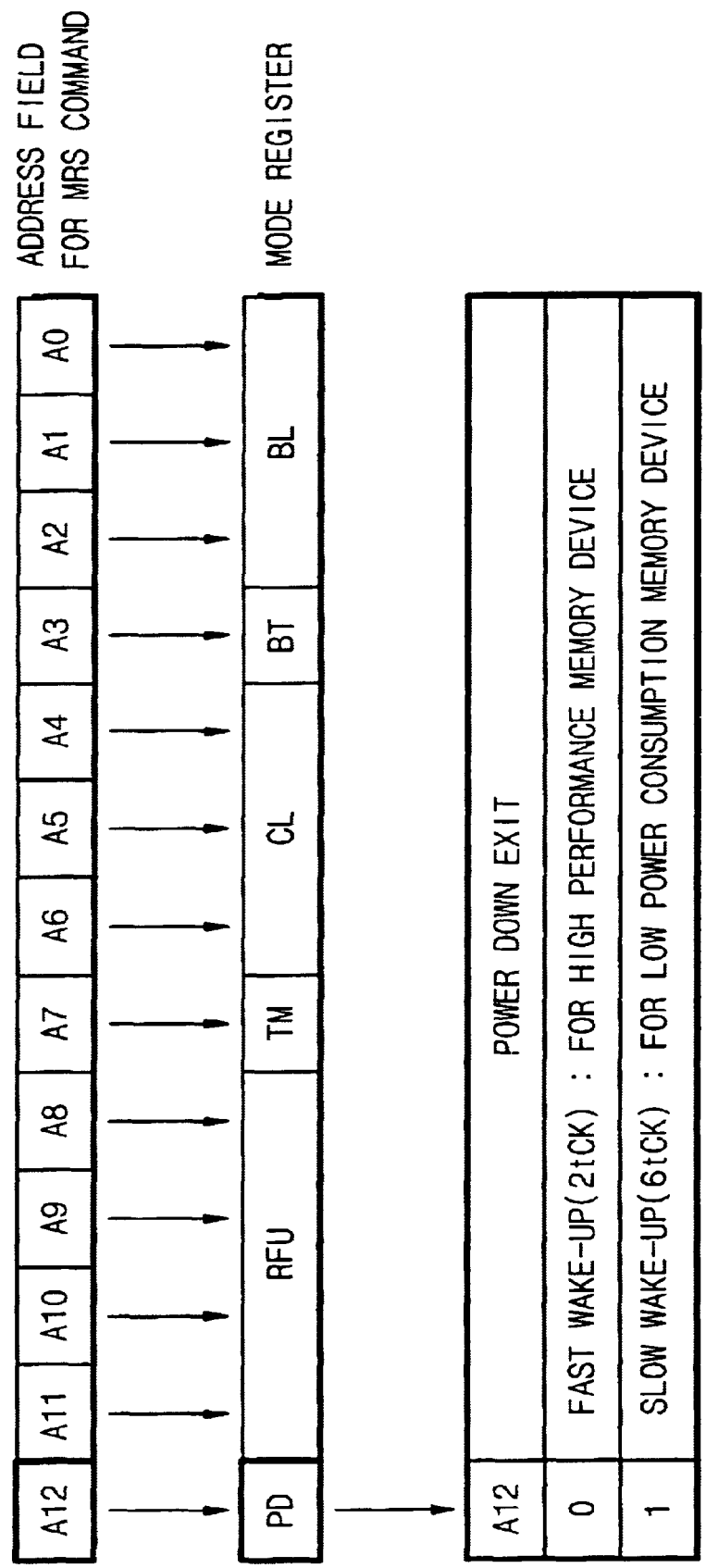
FIG. 5 shows a mode register set according to an embodiment of the present invention.

FIG. 5 shows the use of the address field A0–A12 MRS within the mode register 350. According to the present embodiment, A12 of address field A0–A12 is used for providing the power-down exit mode select signal PD. One of the reserved-for-future-use (RFU) field of the mode register 350 is made to correspond to A12. According to this embodiment, a logic "0" at A12 or PD signals a fast wakeup exit mode and a logic "1" signals a slow wakeup or a power-save exit mode. One skilled in the art readily appreciates that although A12 is preferred to correspond to the PD signal, any other address bit of the address field can be used. A manufacturer or a user may select a fast wakeup exit mode for high performance devices such as a desktop computer. A slow wakeup or power-save exit may be selected by manufacturers or users of mobile devices such as PDAs.

Figure 6:
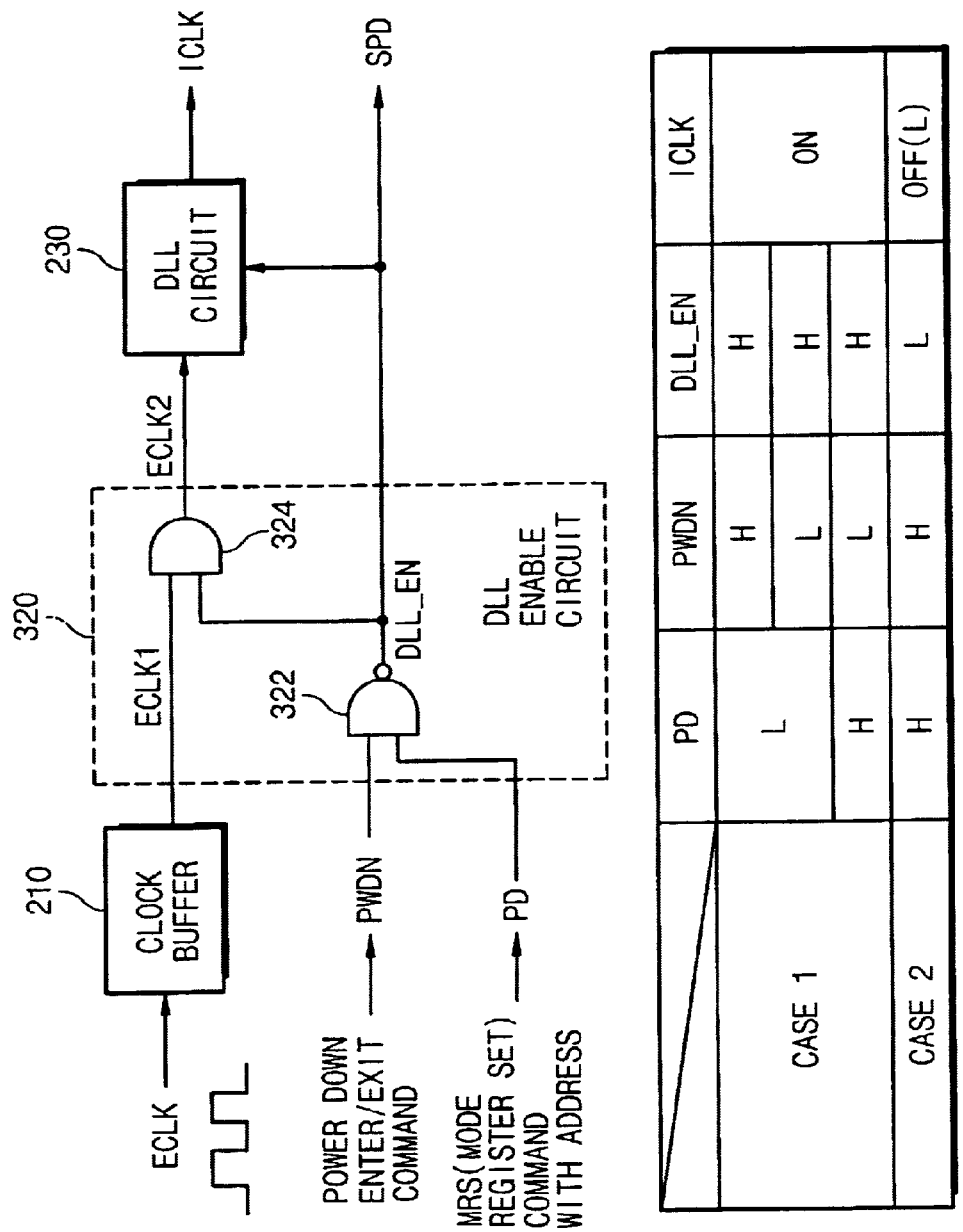
FIG. 6 shows a circuit for controlling a memory according to an embodiment of the present invention.

FIG. 6 shows a circuit for controlling a memory according to an embodiment of the present invention. Clock buffer 210 receives and buffers external clock ECLK and provides a buffered clock ECLK1 to DLL enable circuit 320. Power-down enter/exit PWDN is received by a logic circuit in DLL enable circuit 320. Power-down exit mode select signal PD is input to logic gate 322 which performs a NAND operation of PWDN and PD to output a DLL_EN signal. The DLL_EN signal is input to another logic circuit, in this case an AND gate 324. The other input of AND gate 324 is the buffered clock ECLK1. The DLL_EN signal is also coupled to DLL circuit 230. For purposes of illustration, a power down "enter" command is signaled by PWDN at "1" and PWDN at "0" signals power-down "exit". When PD is "0", a fast wakeup exit mode is selected and when PD is a "1", a slow wakeup (power-save) exit is selected. When both PD and PWDN are at "1", signaling power-down enter and a slow wakeup exit mode, DLL_EN is. "0", disabling gate 324 and the buffered external clock ECLK1 is blocked and, ECLK2 is held at "0" level. The internal clock ICLK is not generated by DLL circuit 230. The memory core 100 is placed in "power down" or "standby" mode. According to a preferred embodiment of the present invention, the DLL_EN signal is also used to turn off circuits within DLL circuit 230, further reducing overall power consumption of the memory device. According to another embodiment, the DLL_EN signal is further used as a supplement power down (SPD) signal to signal the turn-off of other internal circuits such as buffers and drivers, thereby even further conserving power (i.e., power save). For the SDRAM to exit from this power-down selection and mode, the DLL circuit 230 requires the longer (e.g., six (6) cycles) to acquire phase-lock and generate the internal ICLK. According to this embodiment, when PWDN is "0", at power-down "exit" mode, internal clock ICLK is turned on at all times irrespective of the power-down exit mode select PD. When PWDN is high "1", or at power-down enter mode, and PD is at "0" a fast power-down exit mode is selected, the internal clock ICLK is turned on and DLL circuit 230 is left on at all times. In this power-down exit configuration, power-down exit is faster (e.g., two (2) clock cycles). The DLL_EN signal is preferably not used to turn off other circuitry such as clock and data buffers in the fast wakeup exit mode. It is readily apparent to one skilled in the art that the logic gates 322 and 324 used in DLL enable circuit 320 can be substituted by its Boolean equivalent, and the activating/disabling logic can be reversed to accomplish the same functions as described for DLL enable 320. Further, DLL circuit 230 represents any feedback circuit which requires a locking period to accomplish synchronization, such as in a PLL, DLL, DCC (Duty-Cycle Correction), or the like. Although two (2) clock cycles and six (6) cycles are used for fast and power save exit modes, respectively, in the embodiment, it is readily apparent to one skilled in the art that the fast wakeup exit mode can be two (2) to four (4) clock cycles and the power-save exit mode can be at least five (5), six (6) to eight (8) clock cycles, or ten (10) clock cycles.

FIG. 7A shows the timing diagram of the memory device in a power-down exit, slow or power-save wakeup mode. At time Cl the PD signal, from address A12 via mode register 350, transitions to "1". After time C3, a PDWN command at "1" is encountered, signaling power-down entry. Within the same clock cycle, DLL_EN transitions to "0", disabling internal clock ICLK and DLL circuit 230. After time C6, upon receipt of power-down exit command (PWDN transitions to "0"), DLL_EN goes to "1", the DLL circuit 230 is enabled to synchronize the external clock signal to internal clock signal ICLK. During this period, which maybe six (6), eight (8) or ten (10) clock cycles, the memory cannot be accessed until the internal clock ICLK is synchronized to ECLK at time C12.

Referring to FIG. 7B, a timing diagram of a fast wakeup exit mode, address A12 at logic "0" is read from mode register 350 at time Cl and PD is at "0" at all times. A power-down enter signal PWDN at "1" is encountered after time C3. In such configuration, DLL_EN is held at "1" and the clock signal generated from DLL circuit 230 is held at a locked state. The internal clock ICLK is held active to drive the memory core 100. Thus, upon power-down exit command PWDN going "0", at time C6, active command, read command or write command of the memory can commence in two (2) clock cycles at time C8.

Figure 8:
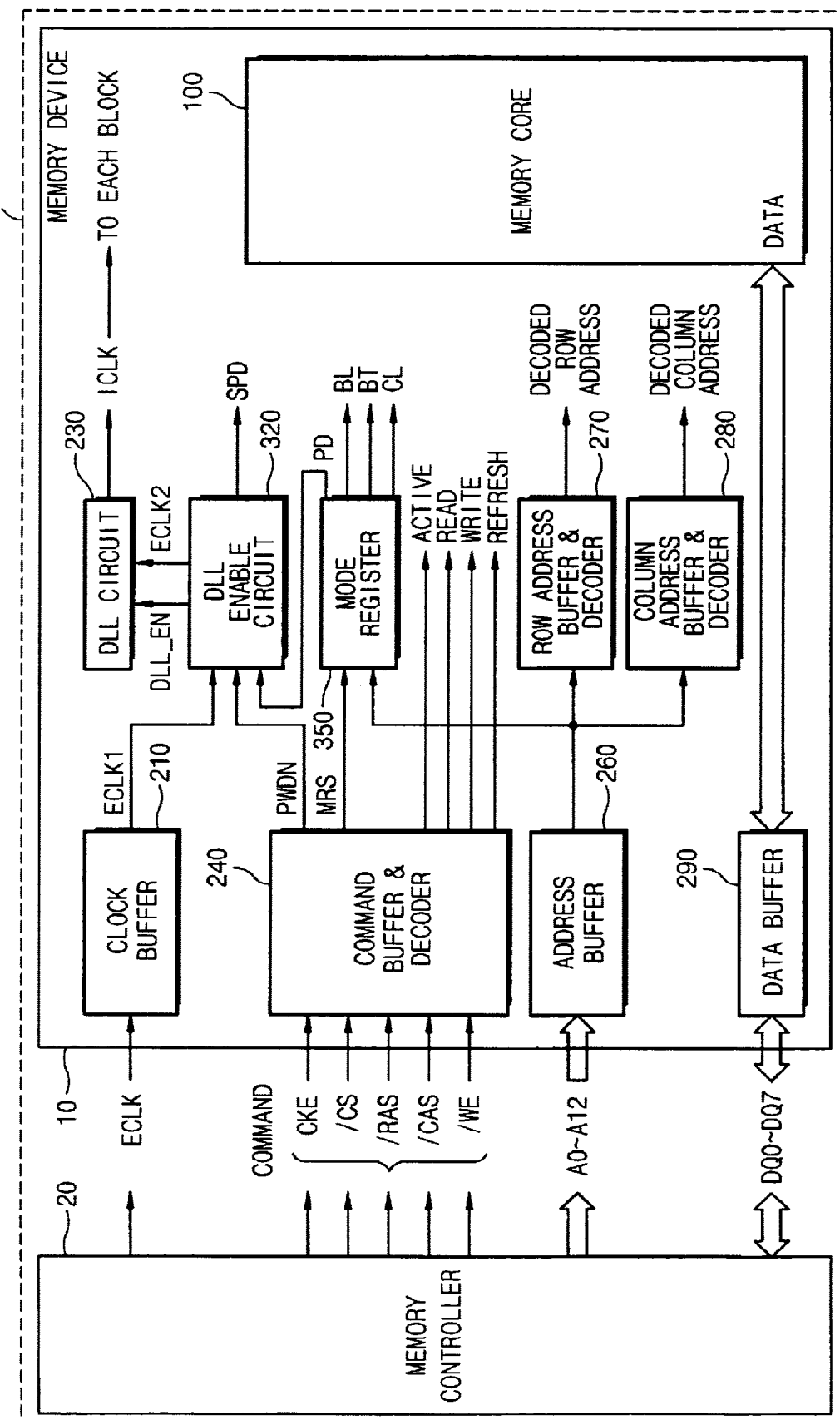
FIG. 8 shows a memory device according to another embodiment of the present invention.

FIG. 8 shows a memory device according to another embodiment of the present invention. In this embodiment, memory device 10 as described in FIG. 4 is driven by a memory controller 20. The commands, address field and external clock signal previously provided externally are now provided by the memory controller 20. The memory controller 20 can be any known controller for controlling an SDRAM.

According to embodiments of the present invention, when memory is exiting from a power-down mode to a normal mode, wakeup time and power consumption of the memory can be selected. The selection can be based on power-down exit information stored in a mode register (MRS). If power conservation in an SDRAM is preferred, such as in mobile products, a slower wakeup but power-save mode is selected. If the memory (e.g., SDRAM) is employed in a high performance where high-speed wakeup is preferred computer, a fast wakeup power-down exit mode is selected.

While embodiments of the present invention have been described, they are merely illustrative and do not have limit the spirit and scope of the invention. The embodiment may be applied to not only an SDRAM but also a memory device or semiconductor integrated circuit having a DLL circuit. Although power-down exit information is exemplarily stored in a field A12 of a mode register (MRS), the information may be stored in any other address field of the MRS based on user's definition. Further, it will be understood that although a wakeup time of the DLL circuit stored in the MRS is set to two (2)/six(6) clock cycles, the wakeup time may be varied. The power-down exit information may be used to control not only an operation of a phase locked loop (PLL) circuit but also an operation of an active termination circuit (On Die Termination (ODT)) within the SDRAM. Therefore, various modifications and changes may be made without departing from the spirit and scope of the invention.

What is claimed is:

1. A circuit for controlling a memory having an array of memory cells arranged in rows and columns, the circuit comprising:
   at least one address decoder for decoding an address field and outputting decoded addresses for addressing the memory; and
   a mode register for storing mode register set (MRS) data used for specifying at least one of a plurality of operation modes of the memory based on the address field, wherein the plurality of operation modes include a plurality of power down exit modes slow wakeup exit mode and a fast wakeup exit mode.

2. The circuit of claim 1, further comprising:
   a clock generator for generating an internal clock signal in synchronization with an external clock signal for clocking the memory; and
   a generator enable circuit for directly or indirectly receiving the external clock signal and a power down command to selectively enable outputting the external clock signal to the clock generator based on the power down command.

3. The circuit of claim 2, wherein the generator enable circuit further receives an exit mode select signal (PD) for selectively enabling the power down command, the exit mode select signal (PD) for selecting at least one of the power-down exit modes.

4. The circuit of claim 1, wherein the memory operates in normal mode within a first number of clock cycles from receipt of slow wakeup exit mode and within a second number of clock cycles from receipt of fast wakeup exit mode, wherein the second number is smaller than the first number.

5. The circuit of claim 4, wherein the first number is at least five and the second number is at least two.

6. The circuit of claim 2, wherein the generator enable circuit receives the exit mode select signal (PD) and outputs a supplemental power-down signal (SPD) to cause a power down of circuitry other than the memory cells.

7. The circuit of claim 6, wherein the circuitry other than the memory cells includes at least a portion of the clock generator.

8. The circuit of claim 3, wherein the address field includes A0 to A12 and the exit mode select signal (PD) corresponds to any of A8 to A12 bits.

9. The circuit of claim 1, wherein the memory is an SDRAM.

10. The circuit of claim 1, wherein the memory is a DDR SDRAM.

11. The circuit of claim 2, wherein the clock generator is a phase-locked loop.

12. The circuit of claim 2, wherein the clock generator is a delay-locked loop.

13. The circuit of claim 2, wherein the clock generator is a duty-cycle correction circuit.

14. The circuit of claim 2, wherein the address field and the power down command are provided from a memory controller.

15. A memory system for controlling a memory having an array of memory cells arranged in rows and columns, the memory control system comprising:
   at least one-address decoder for decoding an address field and outputting decoded addresses for addressing the memory;
   a mode register for storing mode register set (MRS) data used for specifying at least one of a plurality of operation modes of the memory based on the address field, wherein the plurality of operation modes include a slow wakeup exit mode and a fast wakeup exit mode; and
   a memory controller for providing the address field and signals for generating the MRS.

16. The system of claim 15, further comprising:

a clock generator for generating an internal clock signal in synchronization with an external clock signal for clocking the memory; and a generator enable circuit for directly or indirectly receiving the external clock signal and a power-down command to selectively enable outputting the external clock signal to the clock generator based on the power down command.

17. The system of claim 16, wherein the generator enable circuit further receives an exit mode select signal (PD) for selectively enabling the power down command, the exit mode select signal (PD) for selecting at least one of the power-down exit modes.

18. A circuit for controlling a memory having an array of memory cells arranged in rows and columns, the circuit comprising:

at least one address decoder for decoding an address field and outputting decoded addresses for addressing the memory; and a logic circuit for receiving signals specifying at least one of a plurality of operation modes of the memory based on the address field, wherein the plurality of operating modes include a slow wakeup exit mode and a fast wakeup exit mode.

19. The circuit of claim 18, further comprising:

a clock generator for generating an internal clock signal in synchronization with an external clock signal for clocking the memory; and a generator enable circuit for receiving the external clock signal and a power down command to selectively enable outputting the external clock signal to the clock generator based on the power down command.

20. The circuit of claim 19, wherein the generator-enable circuit further receives an exit mode select signal (PD) for selectively enabling the power down command, the exit mode select signal (PD) for selecting at least one of the power-down exit modes.

21. A method of controlling a memory having an array of memory cells arranged in rows and columns, the method comprising:

decoding an address field and outputting decoded addresses for addressing the memory; and storing mode register set (MRS) data used for specifying at least one of a plurality of operation modes of the memory based on the address field, wherein the plurality of operation modes include a slow wakeup exit mode and a fast wakeup exit mode.

22. The method of claim 21, further comprising the steps of:

generating by a clock generator an internal clock signal synchronized to an external clock signal, the internal clock signal for clocking the memory; and disabling the clock generator based on a power down command and one of the plurality of power-down exit modes.

23. The method of claim 21, further including the step of assigning one address bit of the address field as a exit mode select signal for selecting one of the plurality of power-down exit modes.

* * * * *

UNITED STATES PATENT AND TRADEMARK OFFICE
CERTIFICATE OF CORRECTION

PATENT NO.    : 6,650,594 B1
DATED         : November 18, 2003
INVENTOR(S)   : Jung-Bae Lee and Dong-Yang Lee It is certified that error appears in the above-identified patent and that said Letters Patent is hereby corrected as shown below:

Column 8,
Line 5, delete "a plurality of power down exit modes slow wakeup exit mode" is replaced with -- …..a slow wakeup exit mode….. --.

Signed and Sealed this

Twenty-eighth Day of February, 2006

JON W. DUDAS
*Director of the United States Patent and Trademark Office*